(12) United States Patent
Kim et al.

(10) Patent No.: US 11,690,274 B2
(45) Date of Patent: Jun. 27, 2023

(54) DISPLAY APPARATUS

(71) Applicant: LG DISPLAY CO., LTD., Seoul (KR)

(72) Inventors: Jaeyul Kim, Gumi-si (KR); Jasung Choi, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 242 days.

(21) Appl. No.: 17/124,850

(22) Filed: Dec. 17, 2020

(65) Prior Publication Data
US 2021/0202622 A1 Jul. 1, 2021

(30) Foreign Application Priority Data
Dec. 30, 2019 (KR) .......... 10-2019-0178074

(51) Int. Cl.
| | | |
|---|---|---|
| H01L 51/00 | (2006.01) | |
| H10K 59/65 | (2023.01) | |
| H10K 50/858 | (2023.01) | |
| H10K 50/86 | (2023.01) | |
| H10K 50/842 | (2023.01) | |

(52) U.S. Cl.
CPC .......... *H10K 59/65* (2023.02); *H10K 50/8426* (2023.02); *H10K 50/858* (2023.02); *H10K 50/865* (2023.02)

(58) Field of Classification Search
CPC ............. H01L 27/3234; H01L 51/5246; H01L 51/5275; H01L 51/5284; H10K 59/65; H10K 50/858; H10K 50/865; H10K 50/8426
See application file for complete search history.

(56) References Cited

U.S. PATENT DOCUMENTS

2022/0163858 A1* 5/2022 Nishiyama ........ G02F 1/136286

FOREIGN PATENT DOCUMENTS

KR  10-2019-0028245 A  3/2019

* cited by examiner

*Primary Examiner* — Victor A Mandala
*Assistant Examiner* — Colleen E Snow
(74) *Attorney, Agent, or Firm* — Morgan, Lewis & Bockius LLP

(57) ABSTRACT

A display apparatus may include: a cover member comprising a hole area; a light shielding layer, an adhesive layer and a display layer that are disposed under the cover member; a first opening provided at the adhesive layer and the display layer corresponding to the hole area; a camera module inserted into the first opening; and an intermediate member disposed between the hole area and the camera module.

17 Claims, 10 Drawing Sheets

(Application of low refraction resin)

(UV hardening)

DISPLAY APPARATUS

CROSS-REFERENCE TO RELATED APPLICATION

This application claims the priority of Korean Patent Application No. 10-2019-0178074, filed on Dec. 30, 2019, in the Korean Intellectual Property Office, the disclosure of which is hereby incorporated by reference in its entirety.

BACKGROUND

1. Technical Field

The present disclosure relates to a display apparatus, and more particularly, to a hole-in-display-type display apparatus provided with a camera hole on a display.

2. Discussion of the Related Art

In the IT era, the field of display technologies for displaying an electric information signal visually has progressed rapidly. Against this backdrop, various types of display apparatuses such as a thin display apparatus, a lightweight display apparatus, and a display apparatus equipped with excellent functions including an energy-efficient display apparatus have been developed.

Typical examples of a display apparatus may include a liquid crystal display (LCD) apparatus, an organic light emitting display (OLED) apparatus and a Quantum Dot Display apparatus and the like.

In recent years, there has been a growing demand for research and development in design as well as technology of display apparatuses. Accordingly, continuous attempts to make display apparatuses thinner (to minimize thickness of display apparatuses) and to improve aesthetic qualities of display apparatuses have been made so as to appeal to consumers and to motivate consumer to purchase display apparatuses.

In addition, full-screen display apparatuses attract consumers' attention. They have the advantages of improving the feeling of immersion of users and covering up their fronts.

For example, for full-screen display apparatuses, all components can be hidden except a hole for a facial recognition sensor and the like. As such, full-screen display apparatuses can have a simple shape. In case their front displays can be simplified, areas except their screens can also be reduced, thereby improving the feeling of immersion of users who see images. However, a change in designs of display apparatuses can result in a deterioration of image quality, a problem that is unexpected when components are configured outside display areas. Quality of display screens is an important factor that should be taken into account in designing display apparatuses where minimum-sized holes can be disposed on displays and which can help improve the feeling of immersion of users.

SUMMARY

Applicants have performed research into technologies for maximizing a display area of a display apparatus and minimizing a bezel area of the display apparatus as a means to improve the feeling of immersion of viewers. To this end, they have devised technologies for minimizing surface areas of members such as a camera, a speaker and the like disposed at a front of a display and for disposing the members having minimized surface areas in the display area. In order for the camera and the like to be disposed in the display area, a part of a display layer and an adhesive layer had to be removed to prepare space for a camera hole.

At the time of manufacturing the display apparatus, external light reached the display layer and abnormalities of the display occurred. It was found that a light shielding layer is needed to shield external light. Even after the light shielding layer was disposed, some leaked light reached the display layer and the applicants performed various experiments for preventing the light leakage.

It was found that charge generated by a user's touch of the display apparatus generated an electromagnetic field and the electromagnetic field affected the display layer, when the display layer and the adhesive layer were removed to form the camera hole.

It was found that a collision between the camera and a cover glass could result in damage when the camera was inserted into the camera hole.

It was found that a collision between the camera and the adhesive layer or the display layer could result in damage when the camera was inserted into the camera hole.

It was found that the camera could not be aligned correctly at a position of the camera hole where the camera should be when the camera and the display layer collided with each other.

Accordingly, embodiments of the present disclosure are directed to a display apparatus that substantially obviates one or more of the problems due to limitations and disadvantages of the related art.

For example, in one aspect, the present disclosure may provide a display apparatus where a camera, a sensor and the like can be disposed in a display, which can have a compact size and which can solve the above-described problems.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display apparatus may comprise a cover member comprising a hole area, a light shielding layer, an adhesive layer, a display layer, a camera module inserted into a first opening, and an intermediate member disposed between the hole area and the camera module, wherein the light shielding layer, the adhesive layer and the display layer are disposed under the cover member and wherein the adhesive layer and the display layer have the first opening corresponding to the hole area.

In another aspect, a display apparatus may comprise a cover member comprising a hole area, a display layer configured to display an image, a light shielding layer and an adhesive layer disposed between the cover member and the display layer, a first opening where a part of the display layer is removed and which is disposed to correspond to the hole area, a camera module inserted into the first opening, and an intermediate member disposed between the hole area and the camera module.

Details of other embodiments are involved in the section of detailed description and the accompanying drawings.

In another aspect, a display apparatus may comprise a cover member comprising a hole area, a light shielding layer, an adhesive layer and a display layer that are disposed under the cover member, wherein an area in which the light shielding layer is disposed is larger than an area in which the adhesive layer and the display layer are disposed, a camera module disposed under the hole area, and an intermediate member disposed between the hole area and the camera module.

The intermediate member may prevent an electromagnetic field, which is caused by charge generated by a user's touch of a cover glass, from affecting the display layer.

The intermediate member may prevent a direct collision between a cover glass and a camera when a manufacturer inserts the camera module into a camera hole and may prevent damage caused by the mutual collision to the cover glass and the camera.

For the display apparatus, the camera module may comprise a hole guide and a camera.

The hole guide may prevent a collision between the camera and the display layer when the camera is inserted into the camera Hole, and may align the camera at a center of the camera hole, thereby guaranteeing optimal performance of the camera.

For the display apparatus, the intermediate member may comprise a high refraction member, a prism member and a low refraction member.

A multi-layered structure and a prism structure of the intermediate member may result in improved efficiency of light collection through total reflection, and the improved efficiency of light collection may result in improved performance of a member such as a camera, a sensor and the like that are sensitive to an amount of light.

For the display apparatus, the light shielding layer may have a second opening corresponding to the camera hole, and the first opening and the second opening may have different diameters.

For the display apparatus, the second opening may have a smaller diameter than the first opening.

The light shielding layer may have an opening smaller than a camera insertion portion such that external light is prevented from coming into the display layer.

For the display apparatus, an extending portion of the hole guide may have a larger diameter than the second opening to contact the light shielding layer.

The hole guide may improve the effect of shielding external light.

For the display apparatus, the prism member may comprise the same material as the high refraction member.

For the display apparatus, the intermediate member may have a first diameter near the hole area and a second diameter near the camera module, and the first diameter and the second diameter may differ.

For the display apparatus, the hole guide may comprise a black material for absorbing light and may comprise a porous material capable of absorbing an impact.

Advantages of the present disclosure are not limited to the above-described ones. Additionally, other advantages that have not been mentioned may be clearly understood from the following description by one having ordinary skill in the art to which the disclosure pertains.

Details relating to the above-described problems, solutions and advantages are not intended to specify essential features described in the appended claims. Thus, the scope of the right to the claims is not limited by the details in the section of summary.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
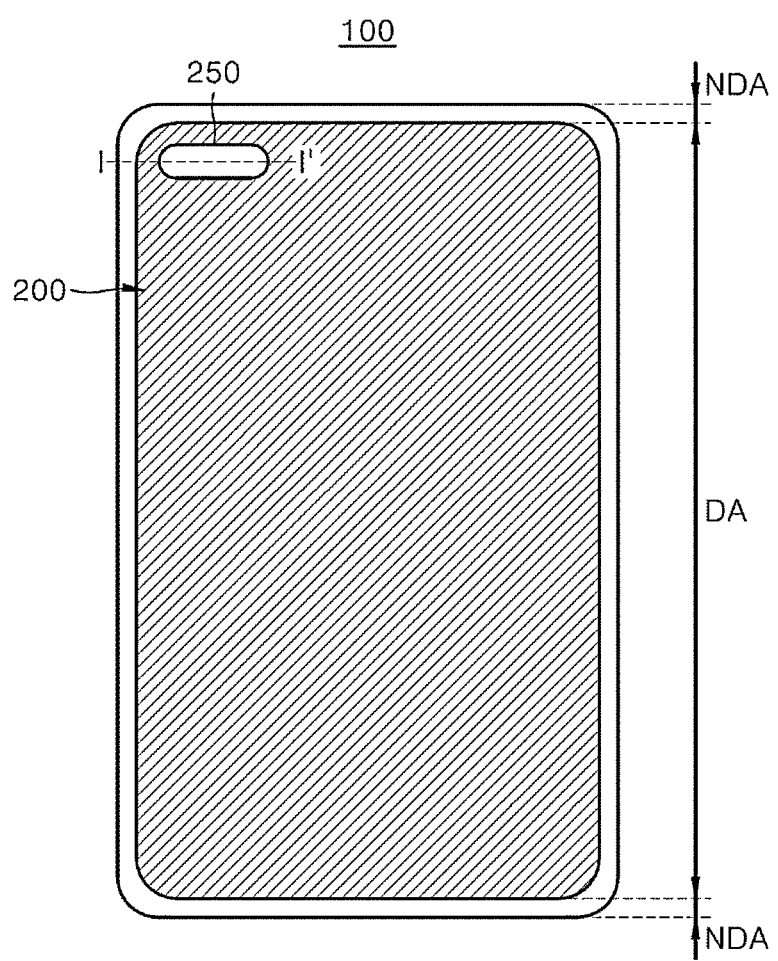
FIG. 1 is a plan view illustrating a display panel according to an aspect of an embodiment.

Advantages and features of the present disclosure and a method of achieving the same may be clearly understood from embodiments that are described with reference to the accompanying drawings. The present disclosure, however, may be implemented in various different forms, and should not be construed as being limited only to the embodiments set forth herein. Rather, these embodiments are provided as examples so that the present disclosure may be thorough and complete and that the scope of the disclosure will be fully conveyed to one having ordinary skill in the art to which the disclosure pertains. The present disclosure should be defined only according to the scope of the appended claims.

The shapes, sizes, ratios, angles and number of components illustrated in the drawings for describing embodiments of the present disclosure are given only as examples, and the present disclosure is not limited to details set forth herein. Throughout the specification, like reference numerals denote like components. In describing the present disclosure, detailed description of well-known technologies including related arts will be omitted if it is deemed to make the gist of the disclosure unnecessarily vague. Throughout the specification, unless explicitly indicated otherwise, the terms "comprise", "have", "being comprised of" and the like should imply the inclusion of any other component but not the exclusion of any other component, and the singular forms "a", "an" and "the" are intended to include the plural forms as well.

In describing a component, the margin of error should be considered though not explicitly described.

When spacial terms such as "on", "at an upper portion", "at a lower portion", "being adjacent to" and the like are used in the present disclosure, one or more additional components may be interposed between two components unless terms such as "right" or "directly" are used.

When temporal terms such as "after", "next", "following", "before" and the like are used to describe a temporal order, one or more additional events may be interposed between two events unless terms such as "right" or "directly" are used.

In describing components of the present disclosure, terms such as first, second and the like may be used. These terms are only intended to distinguish a component from another component, and the components are not limited according to such terms. Certainly, a first component described below may be a second component within the technical spirit of the disclosure.

Terms such as first, second, A, B, (a), (b) and the like may be used herein when describing components of the present disclosure. These terms are intended to distinguish one component from another component, and the essence, order, sequence, or number and the like of the components is not limited by these terms. It should be understood that when any one component is described as being "connected," "combined," or "coupled" to another component, they may be connected or coupled to each other directly, or an additional component may be "interposed" between them, or they may be "connected," "combined," or "coupled" through an additional component.

In the present disclosure, a "display apparatus" may involve a narrow range of display apparatuses such as a liquid crystal module (LCM), an OLED Module, and a quantum dot module that comprise a display panel and a driver for driving the display panel, and may also involve a complete product or a final product, comprising an LCM, an OLED module, a QD module and the like, such as an equipment display apparatus including a laptop, a TV set, a computer monitor, an automotive display apparatus or another type of vehicle and the like, and a set electronic device (or a set electronic apparatus) or a set device (or a set apparatus) and the like such as a mobile electronic device (or a mobile electronic apparatus) and the like including a smart phone or an electronic pad and the like.

The display apparatus in the disclosure may involve a narrow range of display apparatuses themselves from an LCM, an OLED module, a QD module and the like to an application product including an LCM, an OLED module, a QD module and the like or to a set device that is a final consumer device.

In some cases, an LCM, an OLED module, a QD module and the like comprising a display panel and a driver and the like may belong a narrow range of "display apparatuses", and an electronic device that is a final product comprising an LCM, an OLED module and a QD module may belong to a "set device". For example, a narrow range of display apparatuses may comprise a display panel of LCD, OLED or QD, and a source PCB that is a controller for driving the display panel, and a set device may further comprise a set PCB that is a set controller electrically connected to the source PCB and configured to control the entire set device.

All types of display panels such as a liquid crystal display panel, an organic light emitting diode (OLED) display panel, a quantum dot (QD) display panel, an electroluminescent display panel and the like may be used as the display panel of the embodiment. Accordingly, the display panel of the embodiment is not limited to a display panel that comprises a flexible substrate for an OLED display panel and a backplane support structure under the flexible substrate for bezel bending. Additionally, the display panel used for the display apparatus according to aspects of embodiments of the disclosure may not have a limited size and shape.

In case a display panel is an OLED display panel, the display panel may comprise a plurality of gate lines, a plurality of data lines, and pixels formed in areas where the gate lines and the data lines are crossed. Additionally, the display panel may comprise an array comprising a thin film transistor that is a component for optionally supplying a voltage to each pixel, an organic light emitting diode (OLED) layer on the array, an encapsulation substrate or an encapsulation layer disposed on the array to cover the OLED layer, and the like. The encapsulation layer may protect the thin film transistor and the OLED layer and the like from an external impact, and may prevent moisture or air from being infiltrated into the OLED layer. Additionally, a layer formed on the array may comprise an inorganic light emitting layer, e.g., a nano-sized material layer or a quantum dot and the like.

FIG. 1 illustrates a front of the display panel 100. A cover glass 200 may be provided with a display area (DA) and a hole 250 for a camera or for a sensor and the like. The display panel 100 may be a hole-in-display-type one where a hole 250 for a camera or for a sensor and the like is disposed in the display area (DA), and may not be limited by its term. In case the hole 250 for a camera or for a sensor is provided in the display area (DA), a bezel or a non-display area (NDA) that corresponds to an edge surrounding the display area (DA) may become thin. The thin non-display area (NDA) may result in a simple design, and an improved sense of immersion of viewers who see images and the like.

The camera hole 250 may be provided at a center or at one side of an upper portion of a cover glass 200. The center of the upper portion or one side of a lower portion is described with respect to the drawing. In the disclosure, terms indicating directions and positions are described with respect to the drawings. Accordingly, an "upper portion" may also be described as a "top" or a "front" and a "lower portion" may also be described as a "bottom" or a "rear" or a "back" and the like.

Figure 2:
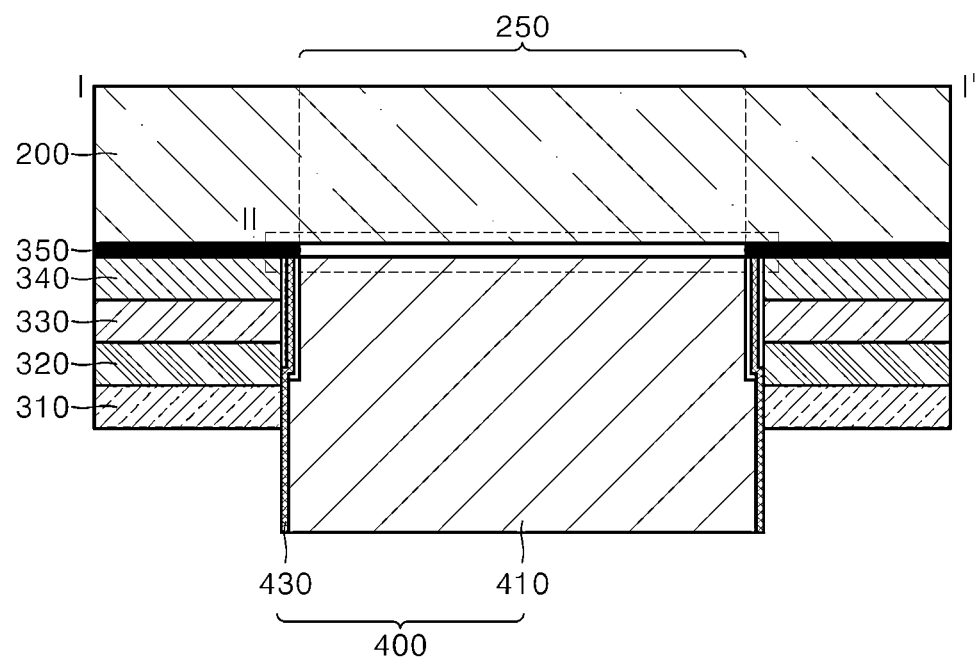
FIG. 2 is a cross-sectional view along line I-I' in FIG. 1.

FIG. 2 is a cross-sectional view along line I-I' in an area near the camera hole 250 in FIG. 1.

Referring to FIG. 2, the cover glass 200 may be disposed in an uppermost layer, and a light shielding layer 350, an adhesive layer 340, a polarizing layer 330, and a display layer 320 and a back plate layer 310 may be consecutively disposes under the cover glass 200. A camera module 400 may be disposed under an area where the camera hole 250 is disposed. The camera module 400 may comprise a camera 410, a hole guide 430 and a sensor for a camera or for facial recognition and the like.

Referring to FIG. 2, an area where the light shielding layer 350 is disposed may differ from an area where the polarizing layer 330, the display layer 320, and the back plate layer 310 are disposed. For example, the area where the light shielding layer 350 is disposed or an area where the light shielding layer 350 is removed may be identical with the area of the camera hole 250. However, the adhesive layer 340, the polarizing layer 330, the display layer 320 and the back plate layer 310 may be removed further widely than the light shielding layer 350 and the camera hole 250. An area where the adhesive layer 340, the polarizing layer 330, the display layer 320 and the back plate layer 310 are removed may be referred to as a rear hole area. A camera module 400 may be disposed in the rear hole area where the adhesive layer 340 to the display layer 320 are removed. The light shielding layer 350 may be disposed further widely than the other layers because quality of a displayed image may be deteriorated when light input from the outside is input to the adhesive layer 340 or the display layer 320 disposed under the light shielding layer 350. When the light shielding layer 350 is formed further widely than the rear hole area, light may reach the camera module 400 only and may not be radiated to the rear hole area. The area where the light shielding layer 350 is formed further widely may be referred to as a buffer area (BA). The light shielding layer 350 may be made of a material that may shield and absorb light. For example, a black matrix (BM) commonly used in a display process or a metallic material having excellent reflectivity may be used for the light shielding layer 350. However, a metallic material may be easily noticed in the display area (DA). Accordingly, the black matrix may be used for the light shielding layer 350. The light shielding layer 350 may be attached to the adhesive layer 340 in a state where an about 6-μm-thick light shielding layer 350 is applied onto the cover glass 200. A thickness of the light shielding layer 350 may not be limited to details set forth in the disclosure.

The camera module 400 may comprise a camera 410 and a hole guide 430. The hole guide 430 may prevent an impact that is applied on the display layer 320 or the polarizing layer 330 when the camera 410 is attached to the rear hole area. The hole guide 430 may be made of a porous synthetic resin like sponge. The hole guide 430 allows the camera module 400 to be assembled while maintaining its shape to surround the camera 410 rightly and applying no impact on the display layer 320. The camera 410 may be disposed to face the cover glass 200.

At an upper portion of the display layer 320, a touch electrode layer that may recognize a touch may be disposed under the polarizing layer 330. The touch electrode layer, for example, may be an electrostatic touch-type one, a force touch-type one, or a pen touch-type one that may sense touch pressure but not be limited.

The polarizing layer 330 may be disposed on the touch electrode layer. The polarizing layer 330 may minimize the effect of light, generated from an external light source and coming into the display panel 100, on the display layer 320.

The adhesive layer 340 may be disposed on the polarizing layer 330. The cover glass 200 may be attached to an outermost side of the display panel 100 and may protect the display panel 100 from an external environment. The cover glass 200 may be a cover window, a cover member and the like but not be limited by its term.

Figure 3:
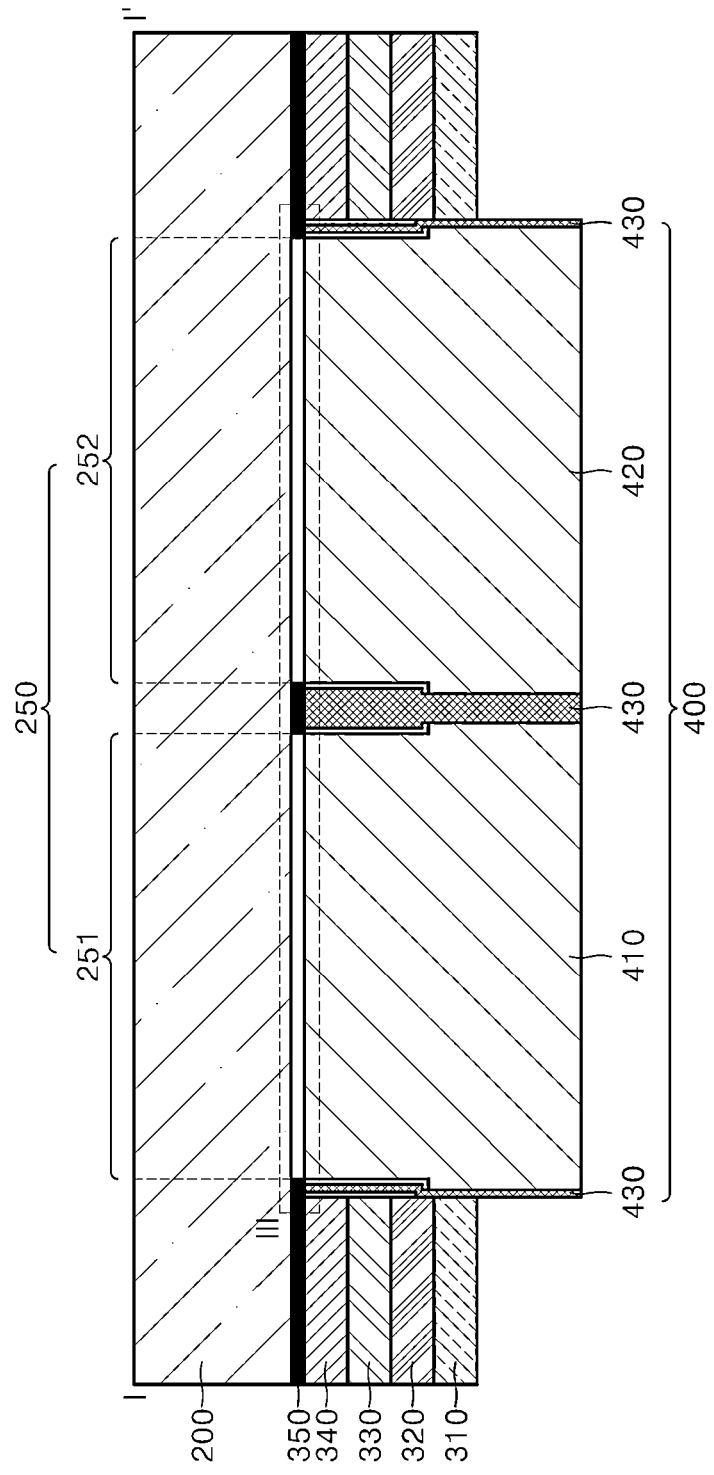
FIG. 3 is another cross-sectional view along line I-I' in FIG. 1.

FIG. 3 is another cross-sectional view along line I-I' in an area near the camera hole 250 in FIG. 1.

As a plurality of cameras or various members such as a facial recognition sensor and the like may be disposed in the front display area. Accordingly, a method for forming a plurality of holes is presented in the embodiment.

In FIG. 3 as in FIG. 2, the cover glass 200 may be disposed in an uppermost layer, and a light shielding layer 350, an adhesive layer 340, a polarizing layer 330, a display layer 320 and a back plate layer 310 may be consecutively disposed under the cover glass 200. The cover glass 200 may be provided with a first camera hole 251 and a second camera hole 252 thereunder, and the first camera hole 251 and the second camera hole 252 together may be referred to as a camera hole 250. A camera module 400 may be disposed below an area where the first camera hole 251 and the second camera hole 252 are disposed. The camera module 400 may comprise a first camera 410, a second camera 420 and a sensor for a camera or for facial recognition and the like. The sensor for a camera or the sensor of facial recognition may be substituted for the second camera 420.

Referring to FIG. 3, an area where the light shielding layer 350 is disposed may differ from an area where the polarizing layer 330, the display layer 320, and the back plate layer 310 are disposed. For example, the area where the light shielding layer 350 is disposed or an area where the light shielding layer 350 is removed may be identical with the areas of the first camera hole 251 and the second camera hole 252. However, the adhesive layer 340, the polarizing layer 330, the display layer 320 and the back plate layer 310 may be removed further widely than the light shielding layer 350 and the camera hole 250. An area where the adhesive layer 340, the polarizing layer 330, the display layer 320 and the back plate layer 310 are removed may be referred to as a rear hole area. A camera module 400 may be disposed in the rear hole area where the adhesive layer 340 to the display layer 320 are removed. The light shielding layer 350 may be disposed further widely than the other layers because quality of a displayed image may be deteriorated when light input from the outside is input to the adhesive layer 340 or the display layer 320 disposed under the light shielding layer 350.

Referring to FIG. 3, a part of the light shielding layer 350 may be left between the first camera hole 251 and the second camera hole 252. The part of the light shielding layer 350 may separate a space between the first camera hole 251 and the second camera hole 252 and may distinguish incident light to provide a clear image. When the light shielding layer 350 is formed further widely than the rear hole area, light may reach the camera module 400 only and may not be radiated to the rear hole area. The area where the light shielding layer 350 is formed further widely may be referred to as a buffer area (BA). The light shielding layer 350 may be made of a material that may shield and absorb light. For example, a black matrix commonly used in a display process or a metallic material having excellent reflectivity may be used for the light shielding layer. However, a metallic material may be easily noticed in the display area (DA). Accordingly, the black matrix may be used for the light shielding layer. The light shielding layer 350 may be attached to the adhesive layer 340 in a state where an about 6-μm-thick light shielding layer 350 is applied onto the cover glass 200. A thickness of the light shielding layer 350 may not be limited to details set forth in the disclosure.

The camera module 400 may comprise a camera 410 and a hole guide 430. The hole guide 430 may prevent an impact that is applied on the display layer 320 or the polarizing layer 330 when the camera 410 is attached to the rear hole area. The hole guide 430 may be made of a porous synthetic resin like sponge. The hole guide 430 allows the camera module 400 to be assembled while maintaining its shape to surround the camera 410 rightly and applying no impact on the display layer 320. The camera 410 may be disposed to face the cover glass 200. Referring to FIG. 3, the hole guide 430 may be disposed between the first camera 410 and the second camera 420 to prevent interference between the cameras. The first camera 410 and the second camera 420 may be disposed to face the cover glass 200.

At an upper portion of the display layer 320, a touch electrode layer that may recognize a touch may be disposed under the polarizing layer 330. The touch electrode layer, for example, may be an electrostatic touch-type one, a force touch-type one, or a pen touch-type one that may sense touch pressure but not be limited.

The polarizing layer 330 may be disposed on the touch electrode layer. The polarizing layer 330 may minimize the effect of light, generated from an external light source and coming into the display panel 100, on the display layer 320.

The adhesive layer 340 may be disposed on the polarizing layer 330. The cover glass 200 may be attached to an outermost side of the display panel 100 and may protect the display panel 100 from an external environment. The cover glass 200 may be a cover window, a cover member and the like but not be limited by its term.

Figure 4:
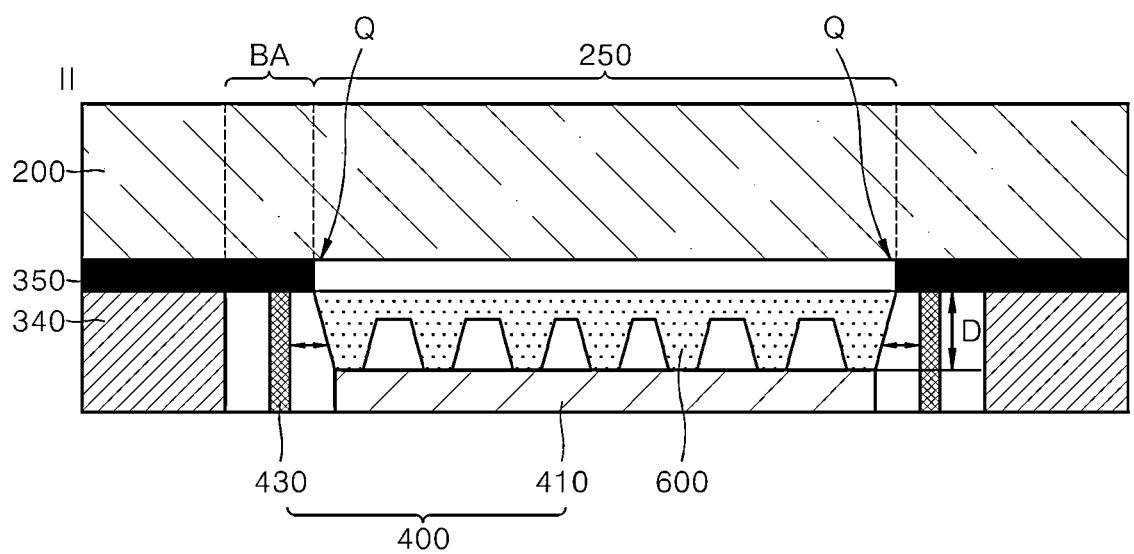
FIG. 4 is an enlarged view illustrating area II in FIG. 2.

FIG. 4 is an enlarged view illustrating area II in FIG. 2 and a cross-sectional view illustrating an area near a camera hole 250.

Referring to FIG. 4, the light shielding layer 350 may protrude further than the adhesive layer 340 at a lower portion of the cover glass 200 to form the camera hole 250. An area where the light shielding layer 350 and the adhesive layer 340 does not overlap may be referred to as a buffer area (BA). The light shielding layer 350 may have an additional space as large as the buffer area (BA) unlike the adhesive layer 340 such that light input from the outside is not input to the adhesive layer 340 or the display layer 320 under the light shielding layer 350. In case light input from the outside reaches the display layer 320, quality of a displayed image may be deteriorated. When the light shielding layer 350 has an additional space as large as the buffer area (BA), external light may be prevented from coming into the rear hole area.

Referring to FIG. 4, an intermediate member 600 may be disposed between the cover glass 200 and the camera 410. When the camera hole 250 is formed in the display area (DA), quality of a displayed image may be deteriorated. Considering properties of the display apparatus, the display area (DA) is often touched. In this case, frictional charge (Q) may be generated on a surface of the cover glass 200. Considering properties of charge, the frictional charge (Q) may create an electromagnetic field and an electric phenomenon may occur. There is a plurality of adhesive layers or organic layers that have a low dielectric constant in the display area (DA) of the display apparatus. Accordingly, a surface frictional charge (Q) of the cover glass 200 does not have a great effect. However, when the camera hole 250 is disposed in the display area (DA), frictional charge (Q) may affect the display layer 320. For example, the camera hole 250, where the display layer 320, the polarizing layer 330 and the adhesive layer 340 are removed to dispose the camera 410, has no electromagnetic field shielding layer having a low dielectric constant. Accordingly, the display layer 320 may be affected by an electromagnetic field caused by charge. The electromagnetic field caused by charge may affect a reference voltage of an organic light emitting diode in the display layer 320, a thin film transistor and the like, and may cause incorrect operations of the organic light emitting diode. To prevent the incorrect operations of the organic light emitting diode, an organic layer or a resin layer that has a low dielectric constant may be used to form the intermediate member 600, and the intermediate member 600 may be disposed between the cover glass 200 and the camera 410. The intermediate member 600 may serve as an electromagnetism shielding layer. The intermediate member 600 may prevent damage that is caused due to a collision between the camera 410 and the cover glass 200 when the camera 410 is inserted into the rear hole area. For example, a camera lens may be disposed at an uppermost portion of the camera 410. When the camera 410 is inserted into the rear hole area, the camera lens may collide with the cover glass 200. When the camera lens and the cover glass 200 collide with each other, abnormality in rigidity and operations may be caused by a crack or fine damage to the camera lens or the cover glass 200. The cover glass 200 and the camera 410 are spaced a predetermined distance corresponding to a thickness D of the intermediate member 600 apart from each other to prevent a direct collision and to absorb an impact. Referring to FIG. 4, the intermediate member 600 may comprise a prism-shaped organic layer or resin layer. On the basis of physical properties and shapes of the intermediate member, external light may be input through total reflection and light collection efficiency may be improved. Improved light collection efficiency may result in enhanced performance of a camera or a sensor that is sensitive to an amount of light. The intermediate member 600 may be disposed at a bottom of the cover glass 200 or may be disposed at a top of the camera 410. For a convenient process, the intermediate member 600 may be disposed on the cover glass 200 rather than a structure such as the camera 410. However, a position of the intermediate member 600 may not be limited.

A camera module 400 may comprise a camera 410 and a hole guide 430. The hole guide 430, as described with reference to FIG. 2, may prevent a collision between the adhesive layer 340 or the display layer 320 and the camera 410 when the camera 410 is inserted into the rear hole area. The hole guide 430 may also allow the camera 410 to be mounted at a predetermined position. For example, the hole guide 430 may fill a gap between the camera 410 and the adhesive layer 340 such that the camera 410 is disposed at a center of the camera hole 250. The hole guide 430 may be made of a porous synthetic resin to absorb an impact. The hole guide 430 may prevent light from being infiltrating into a space between the light shielding layer 350 and the camera 410 such that the light does not reach the display layer 320. For example, an end of the hole guide 430 may extend to contact the light shielding layer 350 and may be made of a material including black pigment to reflect and absorb light excellently. The extending portion of the hole guide 430 may be spaced a predetermined distance apart from the intermediate member 600 not to interfere with the intermediate member 600. In case the hole guide 430 extending to contact the light shielding layer 350 interferes with the intermediate member 600, the intermediate member 600 or the hole guide 430 may not be mounted at a position where the intermediate member 600 or the hole guide 430 should be, in a manufacturing process. For example, the intermediate member 600 may be disposed so that a cross section of the intermediate member 600 may be reduced in a section from the cover glass 200 to the camera 410. The hole guide 430 may also be disposed not to interfere with the intermediate member 600 such that the extending portion disposed to contact the light shielding layer 350 may be spaced a predetermined distance apart from near a section where the lens of the camera 410 is disposed.

Figure 5:
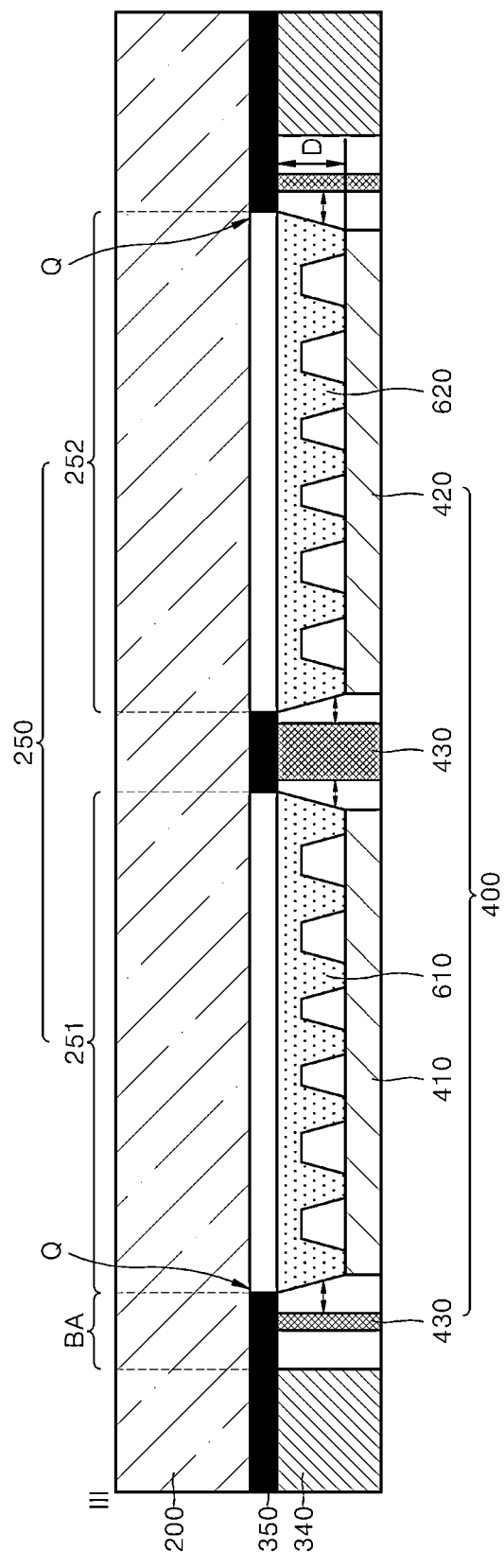
FIG. 5 is an enlarged view illustrating area III in FIG. 3.

FIG. 5 is an enlarged view illustrating area III in FIG. 3 and a cross-sectional view illustrating an area near a camera hole 250.

Referring to FIG. 5, the cover glass 200 may have a camera hole 250 comprising a first hole 251 and a second hole 252. The light shielding layer 350 may protrude further than the adhesive layer 340 at a lower portion of the cover glass 200 to form the camera hole 250. An area where the light shielding layer 350 and the adhesive layer 340 does not overlap may be referred to as a buffer area (BA). The light shielding layer 350 may have an additional space as large as the buffer area (BA) unlike the adhesive layer 340 such that light input from the outside is not input to the adhesive layer 340 or the display layer 320 under the light shielding layer 350. The light shielding layer 350 may also be disposed between the first hole 251 and the second hole 252. In case light input from the outside reaches the display layer 320, quality of a displayed image may be deteriorated. When the light shielding layer 350 has more space that is as large as the buffer area (BA), external light may be prevented from coming into the rear hole area.

Referring to FIG. 5, an intermediate member 600 may be disposed between the cover glass 200 and the camera 410. The intermediate member 600 may comprise a first intermediate member 610 and a second intermediate member 620. When the camera hole 250 is formed in the display area (DA), quality of a displayed image may be deteriorated.

Considering properties of the display apparatus, the display area (DA) is often touched. In this case, frictional charge (Q) may be generated on a surface of the cover glass 200. Considering properties of charge, the frictional charge (Q) may create an electromagnetic field and an electric phenomenon may occur. There is a plurality of adhesive layers or organic layers that have a low dielectric constant in the display area (DA) of the display apparatus. Accordingly, a surface frictional charge (Q) of the cover glass 200 does not have a great effect. However, when the camera hole 250 is disposed in the display area (DA), frictional charge (Q) may affect the display layer 320. For example, the first hole 251 and the second hole 252, where the display layer 320, the polarizing layer 330 and the adhesive layer 340 are removed to dispose the camera 410, has no electromagnetic field shielding layer having a low dielectric constant. Accordingly, the display layer 320 may be affected by an electromagnetic field caused by charge. The electromagnetic field caused by charge may affect a reference voltage of an organic light emitting diode in the display layer 320, a thin film transistor and the like, and may cause incorrect operations of the organic light emitting diode. To prevent the incorrect operations of the organic light emitting diode, an organic layer or a resin layer that has a low dielectric constant may be used to form the first intermediate member 610 and the second intermediate member 620, and the first intermediate member 610 and the second intermediate member 620 may be disposed between the first hole 251 and the first camera 410, and between the second hole 252 and a second camera 420. The intermediate member 600 may serve as an electromagnetism shielding layer. The first intermediate member 610 and the second intermediate member 620 may prevent damage that is caused due to a collision between the first camera 410 or the second camera 420 and the cover glass 200 when the first camera 410 and the second camera 420 are inserted into the rear hole area. For example, a camera lens may be disposed at an uppermost portion of the camera 410. When the camera 410 is inserted into the rear hole area, the camera lens may collide with the cover glass 200. When the camera lens and the cover glass 200 collide with each other, abnormality in rigidity and operations may be caused by a crack or fine damage to the camera lens or the cover glass 200. The cover glass 200 and the camera 410 are spaced a predetermined distance corresponding to a thickness of the intermediate member 600 apart from each other to prevent a direct collision and to absorb an impact. In the embodiment, the first camera 410 and the second camera 420 are described for convenience of description. Instead of the cameras, sensors may be disposed. The first camera 410 and the second camera 420 may have a different size, and the first intermediate member 610 and the second intermediate member 620 may have a different size. In case a lens or a component of the second camera 420 has a cross section larger than that of the first camera 410, the second intermediate member 620 may have a size larger than that of the first intermediate member 610. Additionally, the first camera 410 and the second camera 420 may have different heights on the basis of their purposes and performance, and may be disposed to have different distances from the cover glass 200. Accordingly, the first intermediate member 610 and the second intermediate member 620 may have different heights such that a distance between the first camera 410 and the cover glass 200 differs from a distance between the second camera 420 and the cover glass 200. Referring to FIG. 5, the intermediate member 600 may comprise a prism-shaped organic layer or resin layer. On the basis of physical properties and shapes of the intermediate member, external light may be input through total reflection and light collection efficiency may be improved. Improved light collection efficiency may result in enhanced performance of a camera or a sensor that is sensitive to an amount of light. The intermediate member 600 may be disposed at a bottom of the cover glass 200 or may be disposed at a top of the camera 410. For a convenient process, the intermediate member 600 may be disposed on the cover glass 200 rather than a structure such as the camera 410. However, a position of the intermediate member 600 may not be limited.

A camera module 400 may comprise a first camera 410, a second camera 420 and a hole guide 430. The hole guide 430, as described with reference to FIG. 3, may prevent a collision between the adhesive layer 340 or the display layer 320 and the first camera 410 and a collision between the first camera 410 and the second camera 420 when the first camera 410 and the second camera 420 are inserted into the rear hole area. The hole guide 430 may also allow the first camera 410 and the second camera 420 to be mounted at a predetermined position. For example, the hole guide 430 may fill a gap between the first camera 410 and the adhesive layer 340 such that the first camera 410 is disposed at a center of the first hole 251. The hole guide 430 may be made of a porous synthetic resin to absorb an impact. The hole guide 430 may prevent light from being infiltrating into a space between the light shielding layer 350 and the first camera 410 such that the light does not reach the display layer 320. The second camera 420 may also be disposed at a center of the second hole 252 by the hole guide 430. For example, an end of the hole guide 430 may extend to contact the light shielding layer 350 and may be made of a material including black pigment to reflect and absorb light excellently. In case the hole guide 430 extending to contact the light shielding layer 350 interferes with the intermediate member 600, the intermediate member 600 or the hole guide 430 may not be mounted at a position where the intermediate member 600 or the hole guide 430 should be, in a manufacturing process. For example, the intermediate member 600 may be disposed so that a cross section of the intermediate member 600 may be reduced in a section from the cover glass 200 to the first camera 410. The hole guide 430 may also be disposed not to interfere with the intermediate member 600 such that the extending portion disposed to contact the light shielding layer 350 may be spaced a predetermined distance apart from near a section where the lens of the first camera 410 is disposed.

Figure 6:
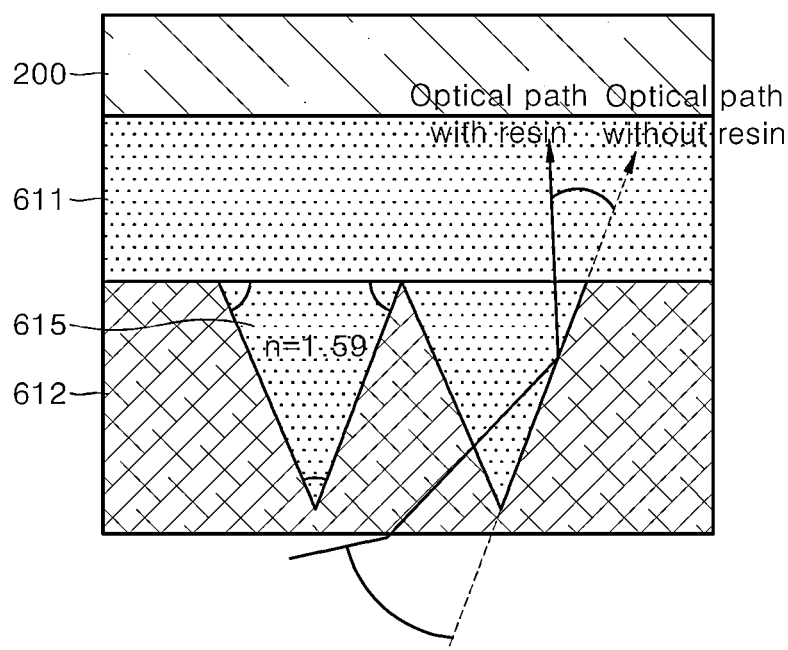
FIG. 6 is an enlarged cross-sectional view illustrating the intermediate member in FIGS. 4 and 5.

FIG. 6 is a cross-sectional view illustrating the intermediate member in FIGS. 4 and 5.

Referring to FIG. 6, the intermediate member 600 may comprise a high refraction member 611, a low refraction member 612 and a prism member 615. Loss of light may occur while the light passes through the camera hole 250 of the cover glass 200. For example, transmittance may be lowered while light passes through the camera hole 250 of the cover glass 200. Higher transmittance may lead to higher sensitivity of a camera or a sensor. The intermediate member 600 may be disposed to increase transmittance of the camera hole 250. Accordingly, transmittance degradation caused by the camera hole 250 of the cover glass 200 may be reduced. The high refraction member 611 may be disposed under the cover glass 200. The low refraction member 612 may be disposed under the high refraction member 611. The prism member 615 may be disposed between the high refraction member 611 and the low refraction member 612. The high refraction member 611 may have a refractive index (n) of about 1.59, and the low refraction member 612 may have a refractive index (n) of about 1.46. However, the refractive index for each member may not be limited. The high refraction member and the low refraction member may have different refractive indices in order for the theory of total reflection to be applied to all the high refraction member 611 and the low refraction member 612 such that light having an incident angle larger than or equal to a critical angle is reflected from boundary surfaces of the high refraction member 611 and the low refraction member 612. Additionally, the prism member 615 may be made of the same material as the high refraction member 611 and may be formed at the same time as the high refraction member 611 is formed. Total reflection may occur because of a difference between refractive indices of the prism member 615 and the low refraction member 612. Totally reflected light of the camera or the sensor may proceed almost perpendicularly with respect to the camera hole 250 when proceeding out of the camera hole 250. A degree to which light is concentrated may be referred to as a degree of light collection. A higher degree of light collection through total reflection may improve transmittance lowered due to the camera hole 250. The low refraction member 612 may comprise a resin having hardness higher than that of a resin of the high refraction member 611 to cope with an impact caused by a collision with the first camera 410.

Figure 7A:
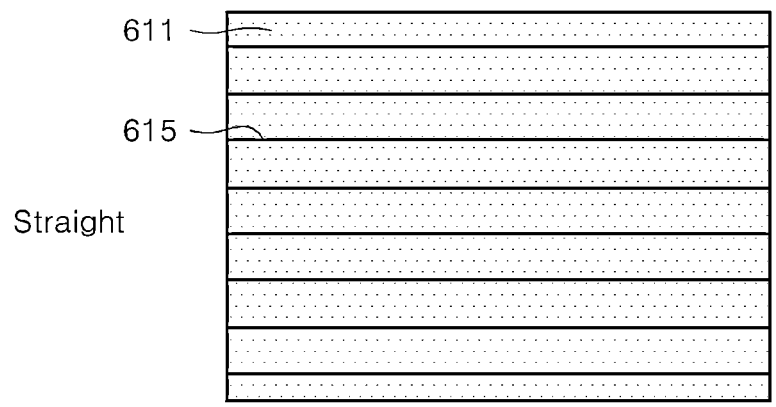
FIGS. 7A to 7C are plan views illustrating the intermediate member in FIG. 6 according to an aspect of an embodiment.
Figure 7B:
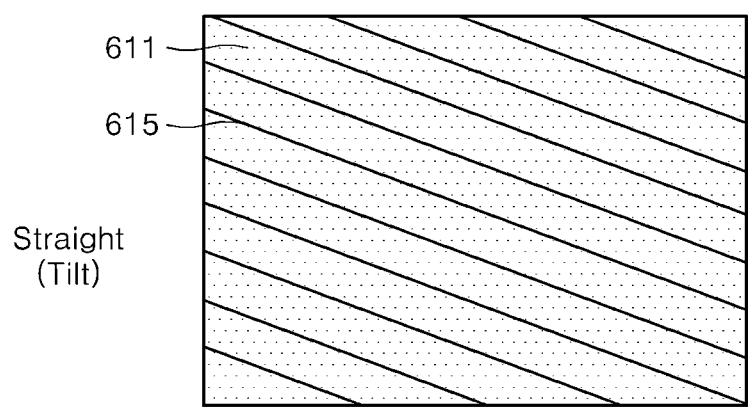
Figure 7C:
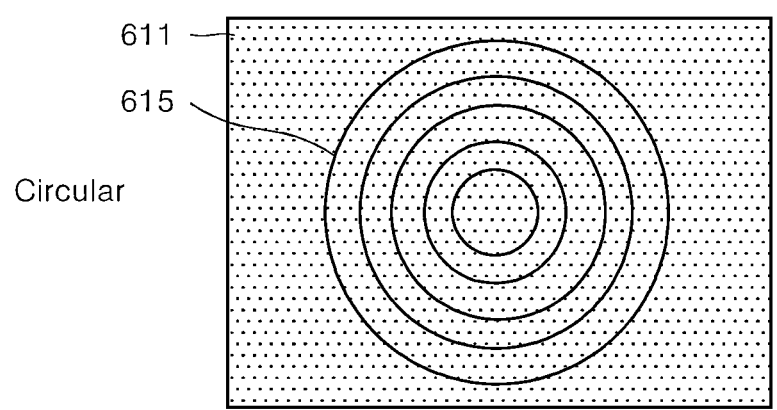

FIGS. 7A to 7C are plan views illustrating an intermediate member.

FIGS. 7A to 7B illustrate prism shapes in the form of a straight line. In case a space, where the intermediate member 600 is disposed, is relatively wide, a plurality of prisms may be disposed between the camera and the cover glass in the form of a straight line that is a simple pattern. The intermediate member may correspond to a space where a plurality of cameras or a plurality of sensor and the like are disposed.

FIG. 7C illustrates circle-shaped prisms. Considering properties of a circle-shaped camera or sensor, a degree of light collection at a center may be improved. The intermediate member may be disposed at a single camera or a single optical sensor.

FIGS. 8A to 8E are flow charts illustrating a manufacturing method of an intermediate member.

FIGS. 8A to 8E illustrate a process of forming an intermediate member 600 in an area of a camera hole 250 of a cover glass 200.

Figure 8A:
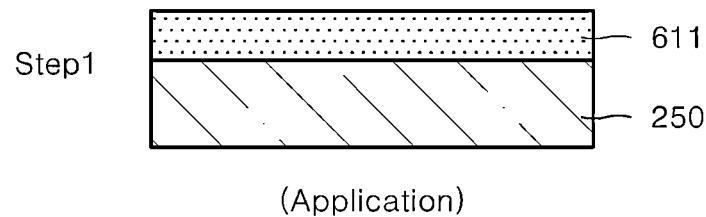
FIGS. 8A to 8E are flow charts illustrating a manufacturing method of an intermediate member.

FIG. 8A illustrates a high refraction member 611 applied onto the area of the camera hole 250. The high refraction member 611, for example, may comprise an organic material comprising a commercial polymer such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer and a combination thereof and the like, but not be limited.

Figure 8B:
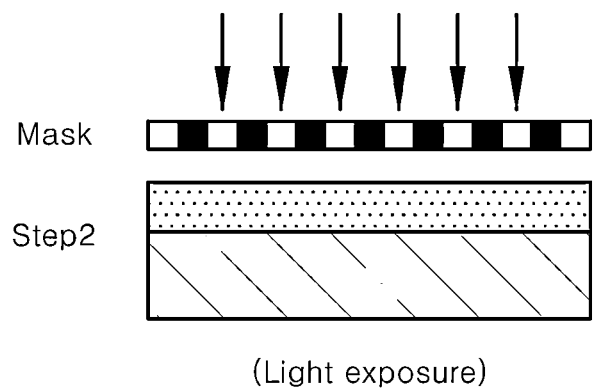

FIG. 8B illustrates a step of forming a prism pattern through a photolithography process. The photolithography process may be performed on an applied high refraction member 611. For example, a patterned mask may be disposed on the camera hole 250 and the high refraction member 611 and may be exposed to infrared light.

Figure 8C:
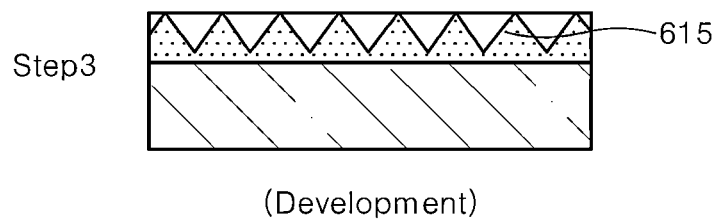

FIG. 8C illustrates development of the high refraction member 611 exposed to light. Through light exposure, a pattern to be left may be hardened or a pattern to be left may be separated from a portion that is not required, to remove a portion that is not hardened in the development process. In this case, the prism member 615 may denote a cross section protruding from the high refraction member 611.

Figure 8D:
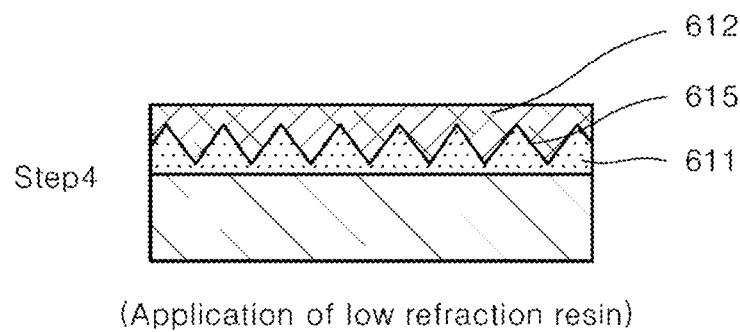

FIG. 8D illustrates a state were the low refraction member 612 is applied onto the developed high refraction member 611. When the low refraction member 612 is applied following the development process in FIG. 8C, the low refraction member 612 may fill an empty space between the prism members 615.

Figure 8E:
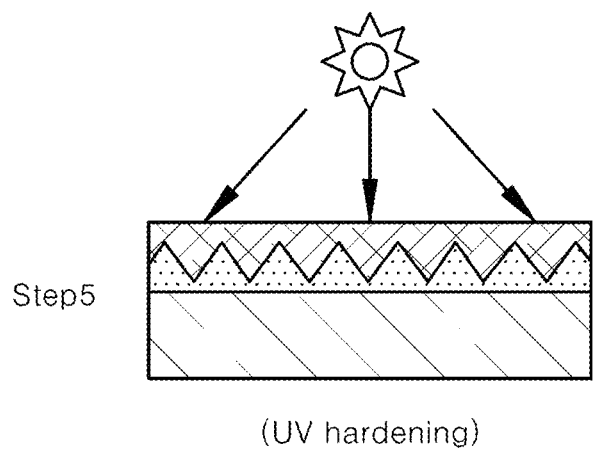

FIG. 8E illustrates the low refraction member 612 that is hardened through optical hardening or thermal hardening after the low refraction member 612 is applied. A resin applied as the low refraction member 612 may be hardened through optical hardening or thermal hardening but not be limited. The optical hardening process and thermal hardening process may be performed at the same time.

A display apparatus according to aspects of embodiments of the present disclosure may involve a liquid crystal display (LCD) apparatus, a field emission display (FED) apparatus, an organic light emitting display (OLED) apparatus, and a quantum dot display apparatus.

The display apparatus according to aspects of embodiments of the present disclosure may also involve a complete product or a final product, comprising an LCM, an OLED module and the like, such as an equipment display apparatus including a laptop, a TV set, a computer monitor, an automotive display apparatus or another type of vehicle and the like, and a set electronic device (or a set electronic apparatus) or a set device (or a set apparatus) and the like such as a mobile electronic device (or a mobile electronic apparatus) and the like including a smart phone or an electronic pad and the like.

A display apparatus according to aspects of embodiments of the present disclosure is described as follows.

A display apparatus according to an aspect of an embodiment may comprise a cover member comprising a hole area, a light shielding layer, an adhesive layer, a display layer, a camera module inserted into a first opening, and an intermediate member disposed between the hole area and the camera module, wherein the light shielding layer, the adhesive layer and the display layer are disposed under the cover member and wherein the adhesive layer and the display layer have the first opening corresponding to the hole area.

For the display apparatus, the camera module may comprise a hole guide and a camera.

For the display apparatus, the intermediate member may comprise a high refraction member, a prism member and a low refraction member.

For the display apparatus, the light shielding layer may have a second opening corresponding to a camera hole, and the first opening and the second opening may have different diameters.

For the display apparatus, the second opening may have a smaller diameter than the first opening.

For the display apparatus, an extending portion of the hole guide may have a larger diameter than the second opening to contact the light shielding layer.

For the display apparatus, the prism member may comprise the same material as the high refraction member.

For the display apparatus, the intermediate member may have a first diameter near the hole area and a second diameter near the camera module, and the first diameter and the second diameter may differ.

For the display apparatus, the hole guide may comprise a black material for absorbing light and may comprise a porous material capable of absorbing an impact.

A display apparatus according to an aspect of an embodiment may comprise a cover member comprising a hole area, a display layer configured to display an image, a light shielding layer and an adhesive layer disposed between the cover member and the display layer, a first opening where a part of the display layer is removed and which is disposed to correspond to the hole area, a camera module inserted into the first opening, and an intermediate member disposed between the hole area and the camera module.

For the display apparatus, the hole area may comprise a first hole and a second hole, and the camera module may comprise a first camera and second camera.

For the display apparatus, the intermediate member may comprise a high refraction member, a prism member and a low refraction member.

For the display apparatus, the camera module may further comprise a hole guide.

For the display apparatus, the hole guide may have an extending portion configured to contact the light shielding layer.

For the display apparatus, the high refraction member and the prism member may comprise the same material.

Features, structures, effects and the like described with reference to the above-described embodiments are involved in at least one embodiment and are not necessarily limited to a single embodiment. Further, features, structures, effects and the like described with reference to at least one embodiment may be combined or modified for other embodiments by one having ordinary skill in the art to which the present disclosure pertains. Thus, details in relation to the combinations and modifications should be construed as being included in the scope of the present disclosure.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
a cover member comprising a hole area;
a light shielding layer, an adhesive layer and a display layer that are disposed under the cover member, wherein the display layer includes an array comprising a thin film transistor and an organic light emitting diode (OLED) layer on the array;
a first opening provided at the adhesive layer and the display layer corresponding to the hole area;
a camera module inserted into the first opening; and
an intermediate member disposed between the hole area and the camera module and in the first opening.

2. The display apparatus of claim 1, wherein the camera module comprises a hole guide and a camera.

3. The display apparatus of claim 2, wherein the light shielding layer has a second opening corresponding to the hole area, and the first opening and the second opening have different diameters.

4. The display apparatus of claim 3, wherein the second opening has a smaller diameter than the first opening.

5. The display apparatus of claim 4, wherein an extending portion of the hole guide has a larger diameter than the second opening to contact the light shielding layer.

6. The display apparatus of claim 5, wherein the extending portion of the hole guide is spaced a predetermined distance apart from the intermediate member.

7. The display apparatus of claim 2, wherein the hole guide comprises a black material for absorbing light and a porous material for absorbing an impact.

8. The display apparatus of claim 1, wherein the intermediate member comprises a high refraction member, a prism member and a low refraction member.

9. The display apparatus of claim 8, wherein the prism member comprises the same material as the high refraction member.

10. The display apparatus of claim 1, wherein the intermediate member has a first diameter near the hole area and a second diameter near the camera module, and the first diameter and the second diameter differ.

11. A display apparatus, comprising:
a cover member comprising a hole area;
a display layer configured to display an image, wherein the display layer includes an array comprising a thin film transistor and an organic light emitting diode (OLED) layer on the array;
a light shielding layer and an adhesive layer disposed between the cover member and the display layer;
a first opening where a part of the display layer is removed and which is disposed to correspond to the hole area;
a camera module accommodated in the first opening; and
an intermediate member disposed between the hole area and the camera module and in the first opening.

12. The display apparatus of claim 11, wherein the hole area comprises a first hole and a second hole, and the camera module comprises a first camera and second camera.

13. The display apparatus of claim 12, wherein the camera module further comprises a hole guide.

14. The display apparatus of claim 13, wherein the hole guide has an extending portion configured to contact the light shielding layer.

15. The display apparatus of claim 11, wherein the intermediate member comprises a high refraction member, a prism member and a low refraction member.

16. The display apparatus of claim 15, wherein the high refraction member and the prism member comprise the same material.

17. A display apparatus, comprising:
a cover member comprising a hole area;
a light shielding layer, an adhesive layer and a display layer that are disposed under the cover member, wherein an area in which the light shielding layer is disposed is larger than an area in which the adhesive layer and the display layer are disposed;
a camera module disposed under the hole area; and
an intermediate member disposed between the hole area and the camera module.

* * * * *